United States Patent [19]
Johnson et al.

[11] Patent Number: 5,326,968
[45] Date of Patent: Jul. 5, 1994

[54] PHOTOELECTRIC SENSOR WITH A CIRCULAR POLARIZING LENS ATTACHED TO ITS HOUSING

[75] Inventors: Donald D. Johnson, Pearl City; Surrinder S. Puri, Schaumberg; Jim Yee, Rockford, all of Ill.

[73] Assignee: Honeywell Inc., Minneapolis, Minn.

[21] Appl. No.: 30,947

[22] Filed: Mar. 12, 1993

[51] Int. Cl.⁵ .................................. G02F 1/01
[52] U.S. Cl. .................................. 250/225; 250/239
[58] Field of Search .................. 250/225, 222.1, 239, 250/216; 359/282, 283, 487, 500, 512, 513

[56] References Cited

U.S. PATENT DOCUMENTS

| | | | |
|---|---|---|---|
| 2,887,566 | 5/1959 | Marks | 359/487 |
| 3,153,740 | 10/1964 | Murphy | 359/487 |
| 3,709,765 | 1/1973 | Miles | 359/513 |
| 3,743,530 | 7/1973 | Tepper | 250/239 |
| 4,020,336 | 4/1977 | Linder | 359/487 |
| 4,786,802 | 11/1988 | Yoshii | |
| 4,838,683 | 6/1989 | Ichihashi et al. | |
| 4,847,488 | 7/1989 | Müller et al. | 250/221 |
| 4,859,062 | 8/1989 | Thurn | |
| 5,115,129 | 5/1992 | Johnson | |
| 5,149,962 | 9/1992 | Maurice | |
| 5,260,827 | 11/1993 | Dziekan | 359/500 |

*Primary Examiner*—David C. Nelms
*Assistant Examiner*—K. Shami
*Attorney, Agent, or Firm*—William D. Lanyi

[57] ABSTRACT

A photoelectric sensor is adapted for use in specific applications which require the additional attachment of a circular polarizer. A piece of circular polarizer material is general disc-shaped with two planar surfaces and a peripheral circular surface. The outer periphery of the disc-shaped circular polarizer is encapsulated within a generally annular molded rim. The molded rim is provided with a protrusion that is generally circular and extends from one of the generally flat surfaces of the rim material. The protrusion facilitates the attachment of the rim to the operative face of a photoelectric sensor through the process of ultrasonic welding. Advantages achieved by this device include the facilitated attachment of the circular polarizer to a photoelectric sensor, the protection of the outer peripheral edges of the laminations of the circular polarizer and the avoidance of distortions of the circular polarizer during the manufacturing process.

14 Claims, 3 Drawing Sheets

PHOTOELECTRIC SENSOR WITH A CIRCULAR POLARIZING LENS ATTACHED TO ITS HOUSING

BACKGROUND OF THE INVENTION

1. Field of the Invention

The present invention is generally related to photoelectric sensors and, more particularly, to photoelectric sensors which comprise a housing structure with a circular polarizing device attached thereto.

2. Description of the Prior Art

Linear polarizing filters are well known to those skilled in the art. They possess special properties for selectively absorbing light vibrations in certain predefined planes. Unpolarized light comprise a complex mixture of vibrations lying in all possible directions transverse to a line of travel. When the unpolarized light is passed through a linear polarizer, its vibrations become confined to a single linear plane and the light is then considered to be polarized. This linearly polarized light can be modified to suppress unwanted reflections and to eliminate glare for a variety of applications.

Circular polarizing filters are also known to those skilled in the art. Circular polarizers typically comprise a linear polarizer combined with a quarterwave retarder whose slow and fast axes are disposed at a 45 degree angle to the axis of the linear polarizer. Unpolarized light passing through the linear polarizer becomes polarized at a 45 degree angle to the axis of the retarder. When this polarized light ray passes through the retarder, its vibration direction is made to move in a helical pattern. After the light ray is reflected from a specular surface, the sense of rotation of the vibration reverses. This rotation is stopped in the return path through the retarder. The light ray is now linearly polarized in a plane 90 degrees to its original polarization plane and is absorbed by the linearly polarized component of the circular polarizer. Certain polarizers are also particularly configured to transmit only infrared radiation. They absorb visible radiation and transmit infrared radiation. These types of filters can be used in association with photoelectric sensors which must operate in environments with high levels of visible radiation.

U.S. Pat. No. 5,149,962, which issued to Maurice on Sep. 22, 1992, describes a proximity detector which uses the Faraday effect and bidirectional transmission. The proximity detector uses the Faraday effect to detect position changes of a target. The proximity detector includes a permanent magnet having a magnetic field that changes as the target moves to or from a predetermined position. A self-referencing optical sensor is provided that detects the changed magnetic field. The optical sensor includes a magneto-optic material positioned near a node of the magnet. Means are also provided to transmit polarized interrogation light along an optical path that includes the magneto-optic material. The optical path is bidirectionally addressed and is nonreciprocal. The optical sensor transduces the changed magnetic field into a modulation of the interrogation light's intensity. Means are provided to detect variations in the interrogation light intensity and to determine a ration such as the difference over the sum ratio for two interrogation light samples that travel the optic path in opposite directions.

U.S. Pat. No. 4,859,062, which issued to Thurn on Aug. 22, 1989, describes an optoelectrical measuring system and apparatus. The invention relates to measuring the surface roughness of a sample material. A beam of light is directed onto the surface and the scattered light distribution is made using a detector array. Either the average deviation or the second moment of the scattered light distribution is then determined and used as measures of the surface roughness.

U.S. Pat. No. 4,838,683, which issued to Ichihashi et al on Jun. 13, 1989, discloses an ophthalmic measuring method and apparatus. According to this invention, the method and apparatus are provided for the purpose of measuring the state of microparticles in the aqueous chamber of an eye to be examined which is irradiated with a laser beam to detect the scattering characteristics in the aqueous chamber of the eye. The laser beam with a predetermined wavelength is projected onto the aqueous chamber of the eye. Light scattered from the aqueous chamber is received with or without a linear polarizer and evaluated in terms of the changes between the scattering characteristics with or without the linear polarizer in order to determine the number or concentration of the microparticles present in the aqueous chamber for the purpose of detecting ophthalmic diseases.

U.S. Pat. No. 4,786,802, which issued to Yoshii on Nov. 22, 1988, discloses an apparatus for measuring photoelasticity. The device permits the control of mechanical stress applied to an elastic body by visualizing phase differences of polarized light transmitted by the elastic body. In such a prior art apparatus, a quarter wavelength plate was used in order to obtain circularly polarized light. However, the precision of the circularly polarized light is worsened when it works in a wide wavelength region. To the contrary, in an apparatus according to this disclosed device, circularly polarized light is obtained by means of Fresnel's rhombic body. As the result of this device, circularly polarized light can be obtained for a wide wavelength region from the visible region to the near infrared region and control of products including thin films and semiconductor substrates can be effected by visualizing mechanical stress therein:

U.S. Pat. No. 5,115,129, which issued to Johnson on May 19, 1992, discloses a photoelectric device with a lens formed in its housing. The photoelectric device is provided with a one piece housing having a first end which is light transmissive and liquid impermeable. An opening is provided at the other end of the tubular structure for insertion of photoelectric and electronic components into the cavity of the housing structure. A cover is used to seal an opening at the second end. The cover is ultrasonically welded to the second end of the tubular structure and a cable means is provided to permit electrical current to pass through the cover at the second end of the housing structure. The first end of the tubular structure, which is transmissive to visible, infrared or ultraviolet light can be formed into one or more lens, depending on the application of the photoelectric device. Threads are provided in the outer cylindrical surface of the housing to aid in attaching the photoelectric device to brackets with the use of threaded nuts.

U.S. Pat. application Ser. No. 07/842,691 (M10-14748) which was filed on Feb. 27, 1992 by Klima and assigned to the assignee of the present application, discloses a photoelectric sensor with a droplet resistant face. The sensor face is generally flat with a groove formed therein to cause droplets to move away from a central portion of the face where they could otherwise adversely interfere with the operation of the photoelectric sensor. The groove provides a discontinuity in the light transmissive face between the locations of a light source and a light sensitive component.

SUMMARY OF THE INVENTION

The present invention provides a photoelectric sensor which comprises a housing that has a light transmissive operative face. A light emitting device is disposed within the housing for directing light through the operative face in a direction away from the housing and a light sensitive device is disposed within the housing for responding to light passing through the operative face in a direction from outside of the housing. A polarizing member is attached to the housing and disposed in light transmission association with the operative face. The polarizing member comprises a planar portion having a periphery in which the periphery is encased in a molded rim and the molded rim is attached to the housing.

This construction permits circular polarizing material to be rigidly and permanently attached to the housing of a photoelectric sensor without the detrimental effects that are possible if alternative methods of attachment are used.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1:
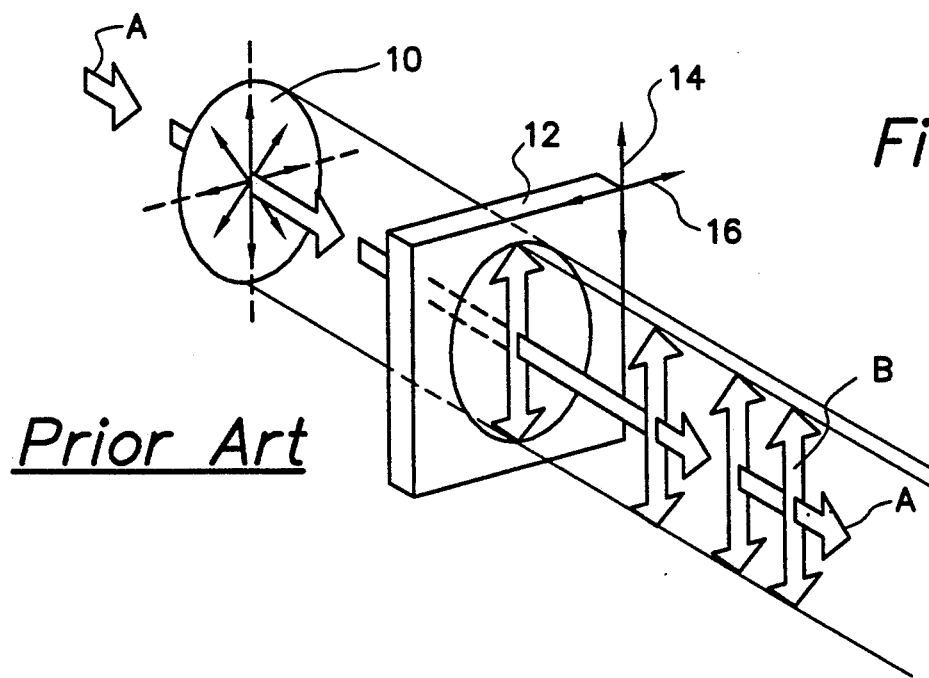
FIG. 1 is a schematic illustration of the operation of a linear polarizer.

Throughout the Description of the Preferred Embodiment, like components will be identified with like reference numerals.

Figure 2:
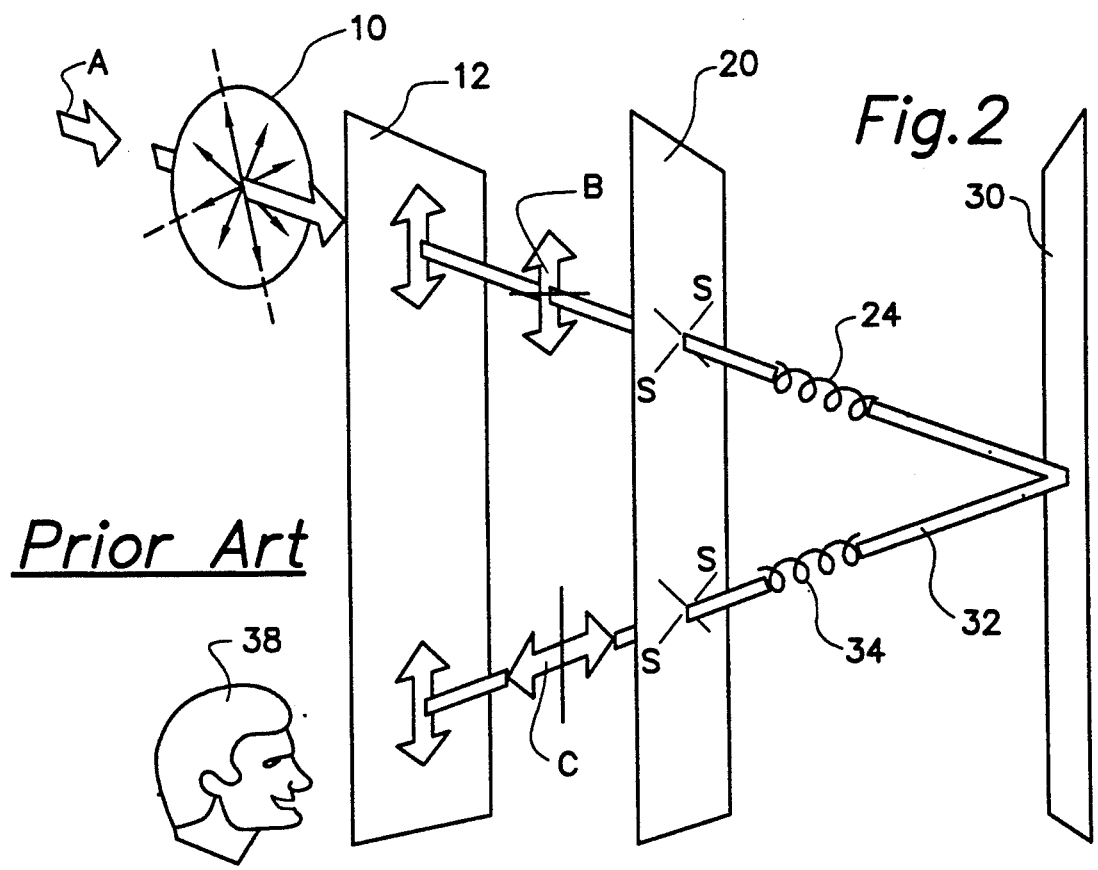
FIG. 2 is a schematic illustration of the operation of a circular polarizer.

FIGS. 1 and 2 illustrate the operation of linear and circular polarizing components. As such, the characteristics illustrated in FIGS. 1 and 2 are well known to those skilled in the art. The arrows A in FIG. 1 represent the direction of travel of light passing from a source of unpolarized light symbolically identified by reference numeral 10 through a linear polarizer 12 which has a transmitting axis 14 and an absorbing axis 16. As the light passes through the linear polarizer, the light is polarized and only that light which is aligned with the transmitting axis is permitted to pass through the linear polarizer. The light passing through the linear polarizer 12 is symbolically represented by arrows B which are aligned in a predefined plane parallel to the transmitting axis 14.

FIG. 2 illustrates light passing in the direction represented by arrows A through a linear polarizer 12 and a quarterwave retarder 20. Beginning as unpolarized light 10, the light is polarized in the direction represented by arrow B after passing through the linear polarizer. Then, the light passes through the quarterwave retarder and is effectively rotated by 45 degrees to result in polarized right circular light represented by reference numeral 24. If the light strikes an object 30 which does not result in a scattering of the circularly polarized light, it will return, along the line identified by reference numeral 32 as light that is polarized left circular and identified by reference numeral 34. As it passes again through the quarterwave retarder 20, the light is polarized in the direction represented by arrow C. This light can not pass through the linear polarizer 12 and, therefore, can not be seen at the position identified by person 38.

With continued reference to FIG. 2, it should be realized that the combination of a linear polarizer 12 and a quarterwave retarder 20 forms a circular polarizer. In a photoelectric sensing application, the unpolarized light 10 would typically be provided by a light emitting diode disposed within the housing of a photoelectric sensor and a photosensitive device, such as a photo diode, a phototransistor or a photodarlington transistor, would also be included within the housing and would sense the light returning from a reflective object. This is referred to as a retroreflective application. The use of a circular polarizer in this manner permits a photoelectric device to sense components which would otherwise not be detectable.

As an example of an application that can advantageously use this type of device, certain applications require the sensing of the presence or absence of light reflective objects. For example, if objects having a mirrored surfaces are to be detected as they pass along a conveyor, standard photoelectric components would not be able to detect the difference between light reflecting from the sensed object and light reflecting from a reflector placed on the opposite side of the conveyor in a retroreflective application. If, on the other hand, a photoelectric sensor with a circular polarizer is used, the reflector used in association with the sensor would be configured to disperse and depolarize the light to permit the sensor to detect the absence of a device between it and the reflector. Reflective objects passing between the sensor and the reflector, however, would not have the dispersing and depolarizing effect. Therefore, applications of this type can be used to detect the presence or absence of highly reflective objects.

In order to adapt the photoelectric sensor for use in applications of this type, a circular polarizer must be attached to the housing of the sensor. This can present severe problems.

Circular polarizers typically comprise an acrylic-laminate structure and are extremely prone to de-lamination if exposed to humidity and moisture. Thus, in the design of a sensor using polarizers of this type it is very important that a very tight seal is established to protect the edges. If the edge of the polarizer is exposed to humidity under certain temperature conditions the de-lamination could occur and result in failure of the photoelectric sensor.

Attachment of the polarizer to the front of a photoelectric device can also be a problem because of incompatibility of the acrylic material of the filter and the housing material which can be a polycarbonate. This is true regardless of whether the filter is of the circular or linear polarizing type.

This invention overcomes these limitations by having the filter molded integrally to a connecting piece of the same material as the housing to ensure material compatibility for bonding, such as ultrasonic welding or with an adhesive.

The present invention eliminates the problems described above and permits a circular polarizer to be rigidly and permanently attached to a photoelectric sensor housing without distorting or destroying the circular polarizer and in a manner which protects the polarizer even in harsh duty applications.

Figure 3:
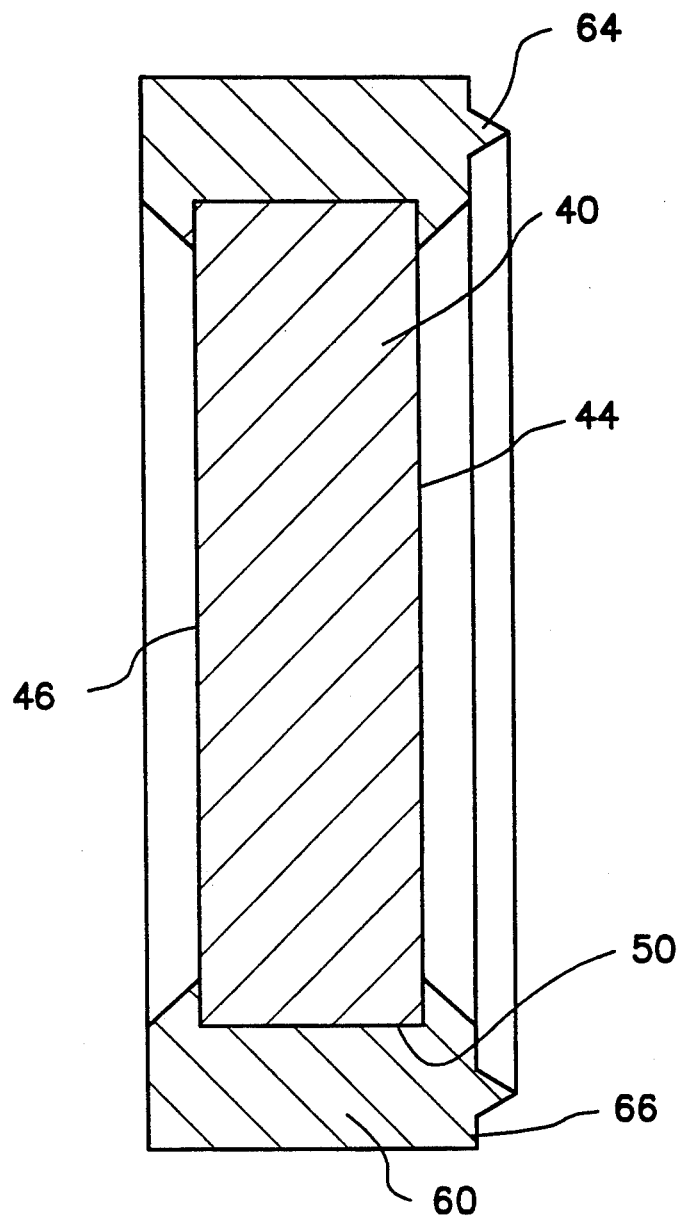
FIG. 3 is a sectioned view of the present invention.

FIG. 3 illustrates a generally circular piece of circular polarizer material 40. Although shown in a section view in FIG. 3, it should be understood that the circular polarizer material 40 is disc-shaped with two planar surfaces, 44 and 46, and a generally circular outer peripheral surface 50. It should also be understood that the circular polarizer is a laminate comprising a linear polarizer and a quarterwave retarder. The circular polarizer material is available in commercial quantities from the Polaroid Corporation. These commercially available circular polarizers are identified by Catalog Numbers in the HNC, HNCP, HACP, HRCP, HGCP and HBCP Series. They are available in a variety of colors and transmittances. They can be laminated in plastic, acrylic or glass and provided in a variety of thicknesses. The selection of a particular type of circular polarizer depends on the particular application in which the photoelectric sensor is intended for use.

With continued reference to FIG. 3, it should be realized that since the circular polarizer 40 is a laminate, its outer peripheral surface 50 makes it susceptible to moisture absorption and the resulting separation of its laminations if the device is subjected to harsh duty. In addition, excessive heat and forces exerted on the circular polarizer 40 can deform it and adversely effect its operability. To hold and protect the circular polarizer 40, the present invention provides an annular molded rim 60 which extends around the outer periphery 50 of the circular polarizer. The circular polarizer 40 is encapsulated within the annular molded rim 60 as shown. The outer peripheral surface 50 is completely protected by this encapsulation even though the planar surfaces, 44 and 46, are not in contact with the material of the molded rim 60. The molded rim 60 is also provided with a circular protrusion 64 that extends from one surface 66 of the molded rim 60.

Figure 4:
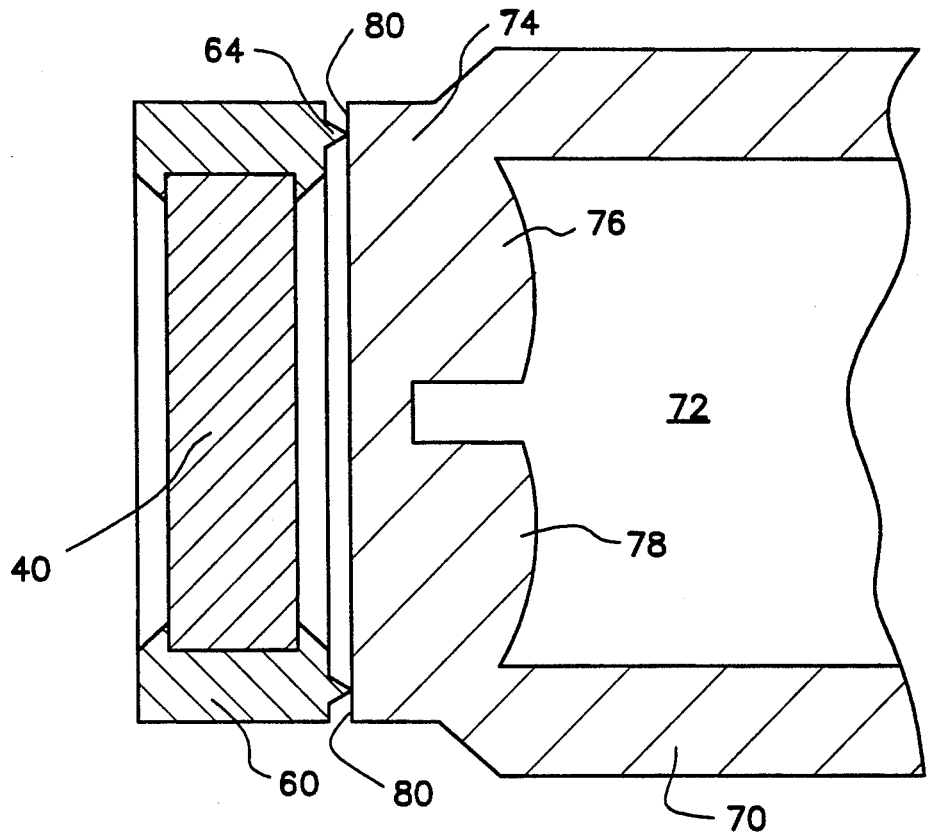
FIG. 4 is a sectioned view of a molded rim of the present invention disposed in contact with the operative face of a photoelectric sensor.

FIG. 4 illustrates a typical housing 70 of a photoelectric sensor. Although no components are shown within the cavity 72 of the housing in FIG. 4, it is well known to dispose a light emitting diode, a photosensitive component and related electronic circuitry within the cavity 72. The end portion 74 of the housing 70 can be shaped to form lens, 76 and 78.

In a manner that is well known to those skilled in the art, light passes from a light emitting diode disposed in the cavity 72 through the end portion 74 toward either a reflector or an object to be sensed that is located between the sensor and the reflector. Following the reflection of the light, it passes back toward the sensor and through the end portion 74 toward a photosensitive device disposed within the cavity 72. The end surface 80 is generally flat and the material of the housing 70 is typically made of a plastic material. In order to provide a circular polarizer in conjunction with the sensor, the present invention encapsulates a circular polarizer 40 in a generally annular molded rim 60 as shown in FIG. 4. The rim 60, the circular polarizer 40 and the generally circular protrusion 64 have been described above in conjunction with FIG. 3. FIG. 4 illustrates the association between the protrusion 64 and the operative face 80 of the photoelectric sensor. After disposing the protrusion 64 in contact with the operative face 80, the components can be ultrasonically welded together. Protrusion 64 allows for a very small area of contact between the two surfaces in order to focus the energy during ultrasonic welding. By localizing the welding area the configuration concentrates more heat in a smaller are and generates an improved blending of the two plastics to create a better joint.

Figure 5:
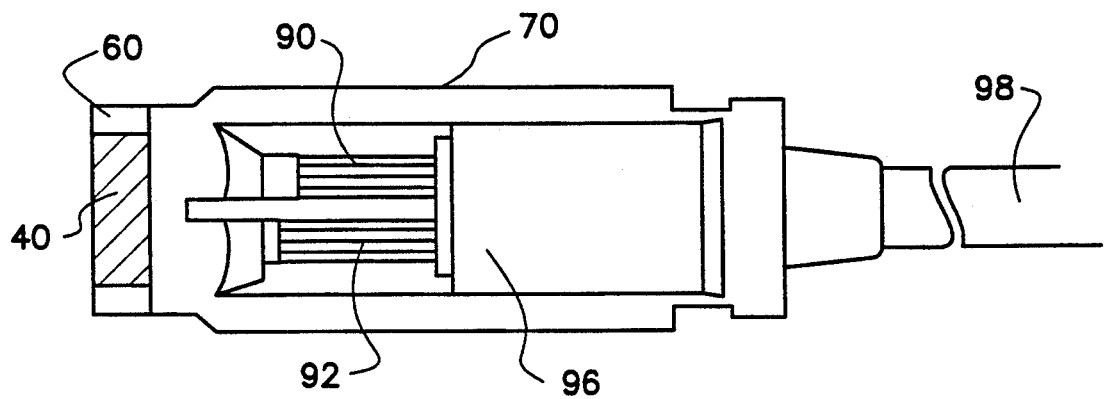
FIG. 5 shows a section view of a sensor attached permanently and rigidly to a circular polarizer.

FIG. 5 illustrates a completed assembly in which the housing 70 and the circular polarizer 40 are rigidly attached together through the use of the molded rim 60. In the section view of FIG. 5, a light emitting diode component 90 and a photosensitive component 92 are shown in association with a schematically represented circuit board 96 that would comprise the necessary electronic circuitry of the sensor. A cable 98 extends from the rear portion of the sensor.

By first encapsulating the circular polarizer 40 within the generally annular molded rim 60, several advantages are achieved by the present invention. First, the outer peripheral surface of the circular polarizer 40 is permanently protected from the elements that could otherwise cause delamination of its layers. In harsh duty applications, the laminations of the circular polarizer would otherwise quickly become separated as a result of moisture and chemicals disposed on the outer edges of the laminations if they are exposed. In addition, the present invention provides another advantage by disposing a circular protrusion 64, or ridge, in contact with the operative face 80 of the sensor during the ultrasonic welding operation. Not only does this facilitate the ultrasonic welding procedure, but it also avoids adverse effects on the circular polarizer 40 during the welding operation by concentrating the welding effects on the protrusion 64 and thus assuring a permanent and secure attachment of the rim 60 to the operative face 80. In addition, the molded rim 60 provides a degree of stiffness to the structure shown in FIG. 3 so that deformation of the circular polarizer 40 is minimized. Another advantage of the present invention is that it permits the attachment of a circular polarizer to a conventionally shaped housing without necessitating particular adaptations to be made to the housing for these purposes.

Although the present invention has been particularly and specifically described and illustrated to show one preferred embodiment, it should be understood that other embodiments are possible within its scope.

The embodiments of the invention in which an exclusive property or right is claimed are defined as follows:

1. A photoelectric sensor, comprising:
    a housing having a light transmissive operative face, said operative face being formed as an integral portion of said housing;
    a light emitting device disposed within said housing for directing light through said operative face in a direction away from said housing;
    a light sensitive device disposed within said housing for responding to light passing through said operative face in a direction from outside of said housing; and
    a laminated polarizing member attached to an outer surface of said operative face of said housing, said polarizing member being disposed in light transmission association with said operative face, said polarizing member comprising a planar portion having a periphery, said periphery being encapsulated within a molded rim, said molded rim being attached to said housing, said molded rim being attached to said housing by ultrasonic welding, said molded rim being fused to said housing along a preformed ridge extending from said molded rim in a direction toward said housing.

2. The sensor of claim 1, wherein:
said light emitting device is an infrared light emitting diode.

3. The sensor of claim 1, wherein:
said periphery is generally circular.

4. The sensor of claim 3, wherein:
said molded rim is generally annular.

5. The sensor of claim 1, wherein:
said housing is generally cylindrical.

6. The sensor of claim 5, wherein:
said operative face is a generally circular surface at an end of said generally cylindrical housing.

7. The sensor of claim 1, wherein:
said housing and said operative face are plastic.

8. A photoelectric sensor, comprising:
a housing having a light transmissive operative face;
a light source disposed within said housing;
a light sensitive device disposed within said housing, said light source and said light sensitive device being disposed in light transmission relation with said operative face; and
a laminated polarizer being attached to an outer surface of said operative face of said housing in light transmission relation with said operative face, said polarizer having a planar portion, said planar portion having a periphery, said periphery being encapuslated within a molded rim, said molded rim being rigidly attached to said housing, said molded rim is ultrasonically welded to said housing, said molded rim is fused to said housing along a raised ridge of said molded rim.

9. The sensor of claim 8, wherein:
said light source is a light emitting diode.

10. The sensor of claim 9, wherein:
said polarizer is a circular polarizer comprising a linear polarizer portion and a quarter wave retarder portion.

11. The sensor of claim 10, wherein:
said housing is generally cylindrical and said operative face is a generally circular end portion of said generally cylindrical sensor.

12. The sensor of claim 11, wherein:
said operative face comprises at least one lens which is integrally formed as part of said housing.

13. The sensor of claim 12, wherein:
said light emitting diode is an infrared light emitting diode.

14. A photoelectric sensor, comprising:
a generally cylindrical housing having a light transmissive operative face disposed at an end of said housing:
a light emitting diode and a light sensitive device disposed within said housing in light transmission relation with said operative face; and
a laminated polarizer being attached to an outer surface of said housing in light transmission relation with said operative face, said polarizer having a planar portion, said planar portion having a periphery, said periphery being encapsulated within a molded annular rim, said molded annular rim having a raised ridge fused with said housing, said light emitting diode being an infrared light emitting diode, said operative face being an integral portion of said housing, said operative face comprising at least one lens, and said housing and said operative face being plastic.

* * * * *